(12) United States Patent
Dea

(10) Patent No.: US 10,921,362 B1
(45) Date of Patent: Feb. 16, 2021

(54) SENSOR FOR MEASUREMENT OF ELECTROSTATIC POTENTIAL WITHOUT CURRENT LOADING AND WITHOUT MECHANICAL CHOPPING

(71) Applicant: The United States of America as represented by the Secretary of the Navy, San Diego, CA (US)

(72) Inventor: Jack Y. Dea, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 82 days.

(21) Appl. No.: 16/528,970

(22) Filed: Aug. 1, 2019

(51) Int. Cl.
*G01R 29/12* (2006.01)

(52) U.S. Cl.
CPC .................... *G01R 29/12* (2013.01)

(58) Field of Classification Search
CPC ............... G01R 29/12; G01R 27/2605; G01R 19/0084; G01R 15/06; G01N 27/22; G01N 27/221; G01N 27/222; G01N 27/223; G01N 27/225; G01N 27/226; G01N 27/227
See application file for complete search history.

(56) References Cited

U.S. PATENT DOCUMENTS

| | | | |
|---|---|---|---|
| 6,950,299 B2 | 9/2005 | Stone et al. | |
| 7,288,881 B2 * | 10/2007 | Takeuchi | B82Y 10/00 313/103 R |
| 8,493,138 B2 | 7/2013 | Strachan et al. | |
| 8,653,822 B1 | 2/2014 | Dea | |
| 8,779,848 B2 | 7/2014 | Pickett et al. | |
| 9,558,888 B2 * | 1/2017 | Baer | B32B 27/365 |
| 2009/0257167 A1 * | 10/2009 | Kanno | H01G 7/06 361/278 |
| 2018/0286587 A1 * | 10/2018 | Wang | C08K 3/20 |

* cited by examiner

*Primary Examiner* — Thang X Le
(74) *Attorney, Agent, or Firm* — Naval Information Warfare Center, Pacific; Kyle Eppele

(57) ABSTRACT

An electric field detecting system is provided that comprises a first metal plate, a second metal plate, a sensor and a detector. The sensor has a first metal layer, a second metal layer and a non-linear permittivity dielectric material disposed between the first metal layer and the second metal layer. The first metal layer is electrically connected to the first metal plate, whereas the second metal layer is electrically connected to the second metal plate. The detector can detect a voltage between the first metal layer and the second metal layer and can determine a magnitude of the electric field based on the detected voltage and a priori information related to a variable capacitance of the non-linear permittivity dielectric material.

20 Claims, 4 Drawing Sheets

US 10,921,362 B1

SENSOR FOR MEASUREMENT OF ELECTROSTATIC POTENTIAL WITHOUT CURRENT LOADING AND WITHOUT MECHANICAL CHOPPING

FEDERALLY-SPONSORED RESEARCH AND DEVELOPMENT

The United States Government has ownership rights in this invention. Licensing inquiries may be directed to Office of Research and Technical Applications, Naval Information Warfare Center, Pacific, Code 3600, San Diego, Calif., 92152; telephone (619)553-3001; email: ssc_pac_t2@navy.mil. Reference Navy Case No. 104,181.

BACKGROUND OF THE INVENTION

The present disclosure is related to systems and methods for measuring ambient electric fields or surface potentials.

In conventional methods for measuring an ambient electric field, an ambient electric field is mechanically chopped by metallic vanes, under which is disposed an alternating current sensor. The near infinite impedance of the direct current field is converted to a finite impedance thorough mechanical chopping. However, the mechanical chopper, which includes a motor and vanes, creates mechanical and electromagnetic noise and also consumes a fair amount of power. Moreover, the chopper method (also known as a field mill) cannot be used to measure the potential of surfaces due to the moving vanes.

Another conventional method to measure an ambient electric field is an optical method to measure the change in polarization when a probe is immersed in the ambient field. In both cases, the respective required sensor is expensive and somewhat cumbersome to use.

What is needed is a system and method to measure an ambient electrostatic field, or the potential on a charged surface, through a simple and inexpensive sensor.

SUMMARY OF THE INVENTION

A system and method in accordance with aspects of the present invention to measure an ambient electrostatic field, or the potential on a charged surface, through a simple and inexpensive sensor.

An aspect of the present disclosure is drawn to an electric field detecting system comprising a first metal plate, a second metal plate, a sensor and a detector. The sensor has a first metal layer, a second metal layer and a non-linear permittivity dielectric material disposed between the first metal layer and the second metal layer. The first metal layer is electrically connected to the first metal plate, whereas the second metal layer is electrically connected to the second metal plate. The detector can detect a voltage between the first metal layer and the second metal layer and can determine a magnitude of the electric field based on the detected voltage and a priori information related to a variable capacitance of the non-linear permittivity dielectric material.

BRIEF DESCRIPTION OF THE DRAWINGS

The accompanying drawings, which are incorporated in and form a part of the specification, illustrate example embodiments and, together with the description, serve to explain the principles of the disclosure. A brief summary of the drawings follows.

DETAILED DESCRIPTION OF THE EMBODIMENTS

An aspect of the present disclosure provides a system and method to measure an ambient electric field. Another aspect of the present disclosure provides a system and method to measure the potential of a surface. The systems and methods, as described herein, do not include a chopper and its associated noise, power consumption, and cost. The systems and methods, as described herein, use the measurement of the capacitance to infer the potential. Even a small capacitance can be accurately measured. In addition, this invention is also able to measure the potential of surfaces in contact with a probe. The surface can be any charged surface, such as metals, semiconductors, many insulators and biological specimens.

Systems and methods in accordance with aspects of the present disclosure exploit the non-linear permittivity of a capacitor having a non-linear permittivity dielectric material to determine a detected charge based on a priori information related to the non-linear permittivity.

The capacitance of capacitors having very high permittivity dielectric material have been measured, and it has been found that a direct current bias on the capacitor changes the value of the capacitance. Measurements were performed that showed a repeatable measurement of the capacitance as a function of the bias voltage. For example, the capacitance at 0.1 volt bias, 23.92 µf, dropped systematically with increasing bias, to 18.18 µf at 1 volt bias. The table below shows the results of one such measurement.

TABLE I

| Bias (volts) | Capacitance (µF) |
|---|---|
| 0.1 | 23.92 |
| 0.2 | 22.79 |
| 0.3 | 22.60 |
| 0.4 | 21.60 |
| 0.5 | 21.05 |
| 0.6 | 20.20 |
| 0.7 | 19.90 |
| 0.8 | 19.30 |
| 0.9 | 19.00 |
| 1.0 | 18.18 |

Figure 1:
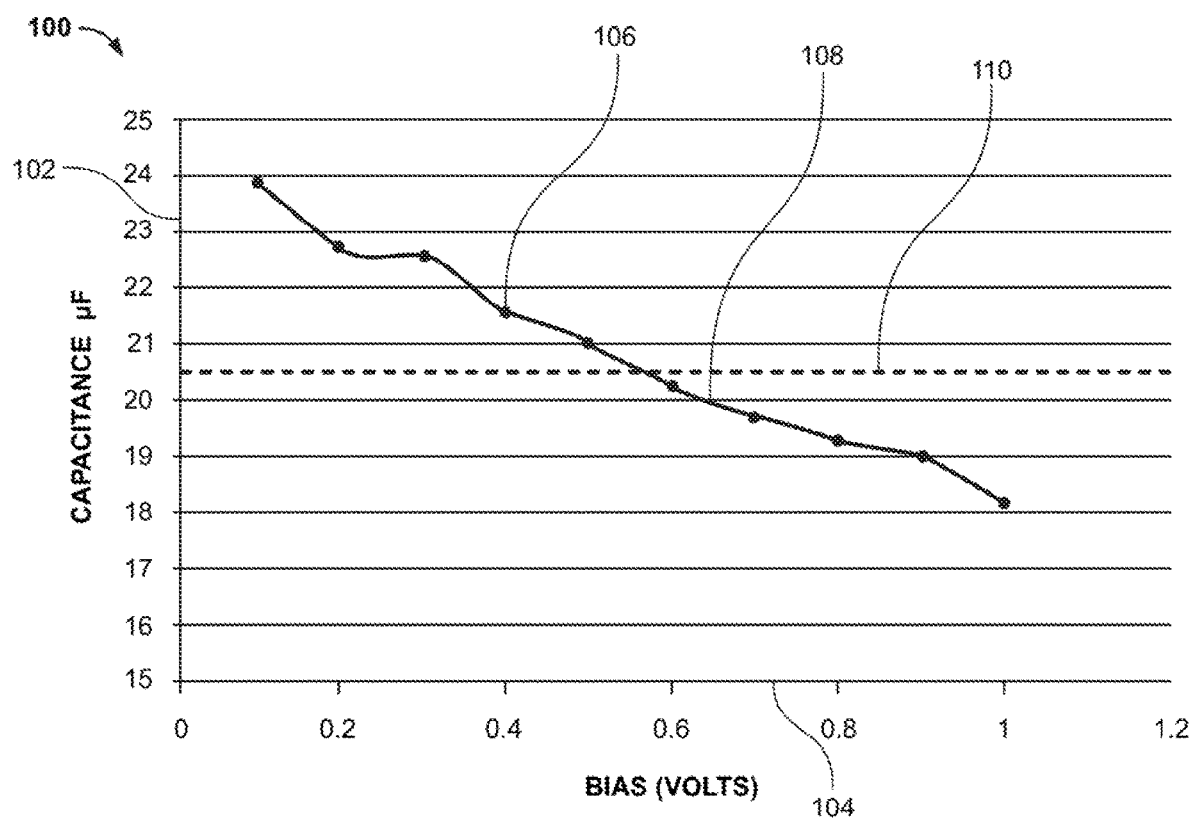
FIG. 1 illustrates a graph of capacitance as a function of bias for a capacitive probe having a non-linear permittivity material in accordance with aspects of the present disclosure.

The values of Table I are illustrated in a graph 100 of FIG. 1. As shown in the figure, graph 100 includes a y-axis 102 of capacitance, measured in micro-Farads (µf), an x-axis 104 of bias, measured in volts (V), a plurality of measured values, a sample of which is indicated as value 106, a non-linear function 108 fitted to the plurality of measured values and a dotted line 110. Y-axis 102 is capacitance, measured in micro-Farads (µf), whereas x-axis 104 is bias, measured in volts (V).

In graph 100, non-linear function 108 shows a monotonic decrease in capacitance with raising bias. This is to be compared with a standard, constant capacitance capacitor, which may have a capacitance of 20.5 µF, as indicated by dotted line 110.

The charge needed to fully charge a capacitor is Q=C*V, where C is the charge in coulombs and V is the potential in volts. In accordance with aspects of the present disclosure, if the non-linear capacitance capacitor is of the order of 0.1 pico-Farads, then the charged needed is in the order of pica-Coulombs which can be provided by atmospheric ions or charges from surfaces. When a calibration chart is created, the capacitance/bias effect can be used to measure the ambient electric potential or an ambient electric field. If the non-linear capacitance capacitor has a small enough capacitance, for example, 0.1 pico-Farads, the non-linear capacitance capacitor will be able to be charged by the existing ambient ions to result in an accurate measurement of the ambient electric field. Such a small capacitive sensor is also able to measure the electric potential on surfaces without generating any significant loading currents, as will be described in more detail below.

A sensor in accordance with aspects of the present disclosure measures the ambient electric potential or the ambient electrostatic field without any significant current loading and without the need for mechanical chopping. Measurement of the Earth's static electric field is one non-limiting example application. Measurement of the potential of surfaces without loading is another non-limiting example application. It is important to note that conventional voltage measurements rely on V=R*I, and involves a loading current I. However, a system in accordance with aspects of the present disclosure measures the actual potential without a loading current.

In general, the ambient electrostatic field cannot be measured with conventional systems because conventional sensors and amplifiers do not have the nearly infinite impedance needed to measure the electrostatic field. Almost always, the impedance is improved by mechanically chopping the electric field so that the impedance becomes an alternating current impedance. However, mechanical choppers are noisy and power hungry. A system in accordance with aspects of the present disclosure solves the chopping problem by eliminating the chopper and uses a solid state sensor. The noise, power and cost of conventional systems are all improved with a system in accordance with aspects of the present disclosure. A system in accordance with aspects of the present disclosure will be a boon to those who are required to measure the ambient electrostatic field, such as the Earth's electric field or the potential on a charged surface, through a simple and inexpensive sensor.

Figure 2:
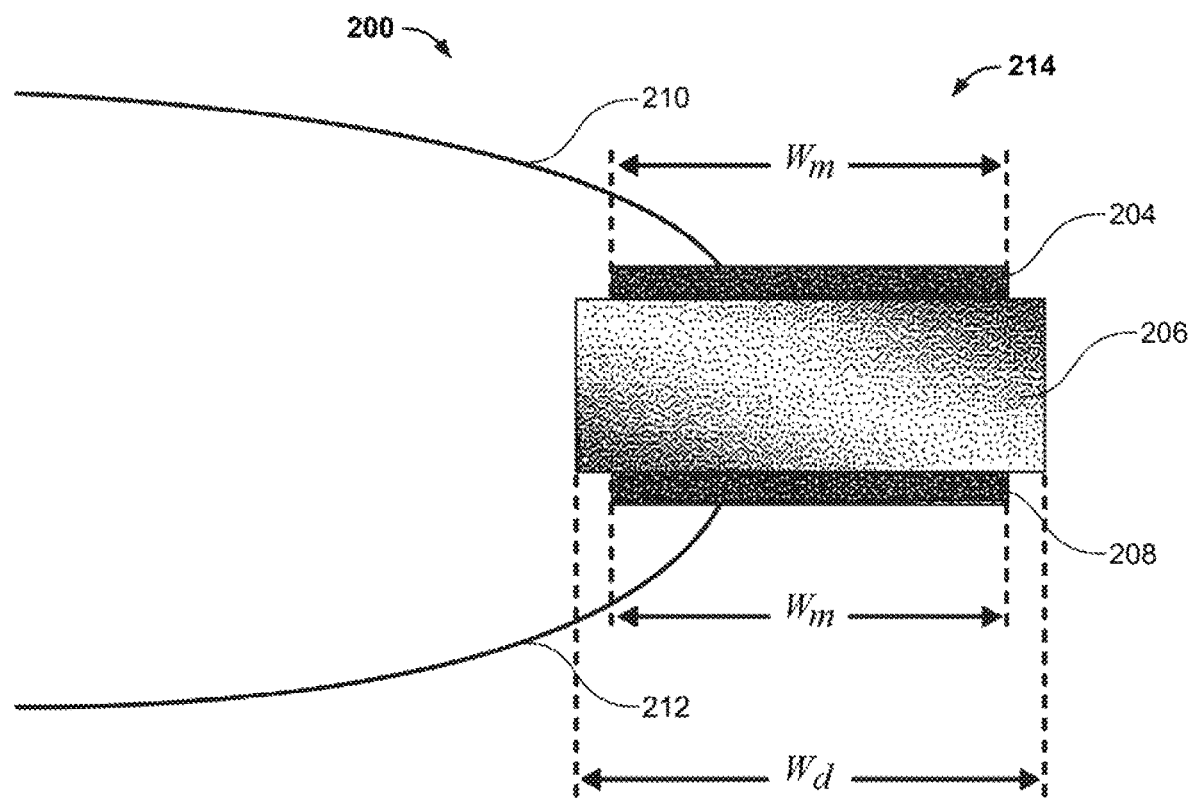
FIG. 2 illustrates an example capacitive sensor having a non-linear permittivity material in accordance with aspects of the present disclosure.

FIG. 2 illustrates an example capacitive sensor 200 having a non-linear permittivity dielectric material in accordance with aspects of the present disclosure. As shown in the figure, capacitive sensor 200 includes a metal layer 204, a non-linear permittivity dielectric material 206, a metal layer 208, a wire 210 and a wire 212. Non-linear permittivity dielectric material 206 is disposed between metal layer 204 and metal layer 208. Wire 210 is electrically connected to metal layer 204, whereas wire 212 is connected to metal layer 208.

Non-linear permittivity dielectric material 206 may be any permittivity dielectric material that has a non-linear capacitance as a function of voltage, non-limiting examples of which include a material selected from a group of materials comprising barium strontium titanate, barium titanate, lead zirconium titanate and combinations thereof. Each of metal layers 204 and 208 and each of wires 201 and 212 may include any known conducting metal or combination of metals.

In this example embodiment, metal layer 204 and metal layer 208 have a similarly sized surface area that is in contact with non-linear permittivity dielectric material 206. This is represented in FIG. 2 by a common width, $w_m$, of each of metal layer 204 and metal layer 208. However, in other example embodiments, metal layer 204 and metal layer 208 have differently sized surface areas that are in contact with non-linear permittivity dielectric material 206.

In this example embodiment, the surface area of each of metal layer 204 and metal layer 208 that is in contact with non-linear permittivity dielectric material 206 is smaller than the total surface area of non-linear permittivity dielectric material 206. This is represented in FIG. 2 by a width, $w_d$, of non-linear permittivity dielectric material 206 being larger than $w_m$. Having non-linear permittivity dielectric material 206 being larger than each of metal layer 204 and metal layer 208 reduces end effects and thereby improves measurement accuracy.

Figure 3:
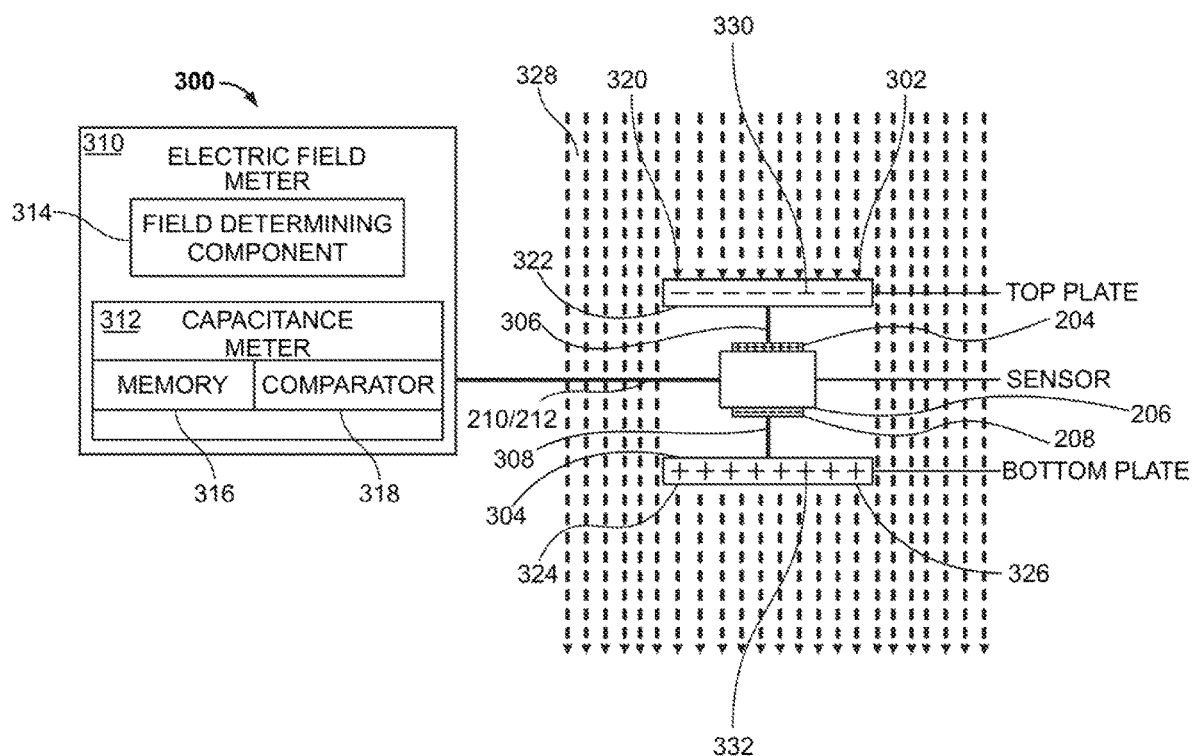
FIG. 3 illustrates an example electric field detecting system in accordance with aspects of the present disclosure.

FIG. 3 illustrates an example electric field detecting system 300 in accordance with aspects of the present disclosure. As shown in the figure, electric field detecting system 300 includes capacitive sensor 200, a top plate 302, a bottom plate 304, a wire 306, a wire 308 and an electric field meter 310. Electric field meter 310 includes a capacitance meter 312 and a field determining component 314. Capacitance meter 312 includes a memory 316 and a comparator 318. Top plate 302 has a top surface 320 and a bottom surface 322. Bottom plate 304 has a top surface 324 and a bottom surface 326. Wire 306 electrically connects metal layer 204 of capacitive sensor 200 to bottom surface 322 of top plate 302. Wire 308 electrically connects metal layer 208 of capacitive sensor 200 to top surface 324 of bottom plate 304. Wires 210 and 212 of capacitive sensor 200 are electrically connected to capacitance meter 312 of electric field meter 310.

In operation, electric field detecting system 300 is arranged such that top plate 302 and bottom plate 304 are disposed within an ambient electric field 328. The atmospheric charges (ions) are guided by the atmospheric electric field lines and collect on the plates. For example, ions within ambient electric field 328 include positively charged and negatively charged ions. Negatively charged ions accumulate on top surface 320 of top plate 302 as indicated by charges 330, which in turn creates positive charges 332 within metal layer 204 of capacitive sensor 200 via wire 306. Conversely, positively charged ions accumulate on bottom plate 304 as represented by positive charges 334, which in turn creates negative charges 336 within metal layer 208 of capacitive sensor 200 via wire 308.

In capacitive sensor 200, positive charges 332 on metal layer 204 and negative charges 336 on metal layer 208 will generate a voltage across non-linear permittivity dielectric material 206. The generated voltage will be based on the non-linear capacitance of non-linear permittivity dielectric material 206, as discussed above. The voltage will be provided to capacitance meter 312 via wires 210 and 212.

In this example, field determining component 314 and capacitance meter 312 are illustrated as individual devices. However, in some embodiments, field determining component 314 and capacitance meter 312 may be combined as a unitary device. Further, in some embodiments, at least one of field determining component 314 and capacitance meter 312 may be implemented as a computer having tangible computer-readable media for carrying or having computer-executable instructions or data structures stored thereon. Such tangible computer-readable media can be any available media that can be accessed by a general purpose or special purpose computer. Non-limiting examples of tangible computer-readable media include physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. For information transferred or provided over a network or another communications connection (either hardwired, wireless, or a combination of hardwired or wireless) to a computer, the computer may properly view the connection as a computer-readable medium. Thus, any such connection may be properly termed a computer-readable medium. Combinations of the above should also be included within the scope of computer-readable media.

In this example, memory 313 and comparator 315 are illustrated as individual devices. However, in some embodiments, memory 313 and comparator 315 may be combined as a unitary device. Further, in some embodiments, at least one of memory 313 and comparator 315 may be implemented as a computer having tangible computer-readable media for carrying or having computer-executable instructions or data structures stored thereon. Such tangible computer-readable media can be any available media that can be accessed by a general purpose or special purpose computer.

Memory 316 has a priori information related to the variable capacitance of non-linear permittivity dielectric material 206. For example, memory 316 may have the functional relationship, or a look up table of values, relating a detected voltage from capacitive sensor 200 to the capacitance of non-linear permittivity dielectric material 206, as discussed above with reference to FIG. 1. Comparator 318 compares the detected voltage as provided by capacitive sensor 200 to the a priori information in memory 316 to determine the capacitance of non-linear permittivity dielectric material 206 of capacitive sensor 200. With the detected voltage and the determined capacitance, comparator 318 is operable to determine the total electric charge, Q, provided on capacitive sensor 200. Capacitance meter then provides the total electric charge Q, to field determining component 314.

Gauss's law indicates that Div $E=\rho/\varepsilon_0$, wherein E is the electric field, $\rho$ is the total electric charge density, and $\varepsilon_0$ is a constant of the permittivity of free space. Field determining component 314 is operable to calculate $\rho$ based Q as provided by comparator 318 and based on the surface area of top plate 302 and bottom plate 304, which is stored in field determining component 314. With the calculated value of $\rho$, and using Div $E=\rho/\varepsilon_0$, field determining component 314 is operable to calculate the electric field strength of ambient electric field 328. In this manner, electric field meter 310 acts as a detector that is able to determine a magnitude of ambient electric field 328 based on the detected voltage and a priori information related to a variable capacitance of the non-linear permittivity dielectric material 206.

In an example embodiment, when the capacitance of non-linear permittivity dielectric material 206 of capacitive sensor 200 is very small, such as 0.1 pico-Farad or less, and the area of top plate 302 and bottom plate 304 are of the order of a few tens of square centimeters, the ambient air ions will be sufficient to charge capacitive sensor 200 for an accurate measurement of ambient electric field 328.

It should be noted that non-linear capacitance capacitors have been known. However, such capacitors, which generally have a relatively high capacitance, have been only conventionally used as simple capacitors. In such conventional uses, the non-linear capacitance is a detriment, wherein much research has taken place to account for or, even negate, the non-linear capacitance aspect of such capacitors. Therefore, exploitation of this non-linear capacitance for use as a field detector, in capacitive sensor 200, is contrary to prior art uses and is a novel aspect of the present disclosure.

Figure 4:
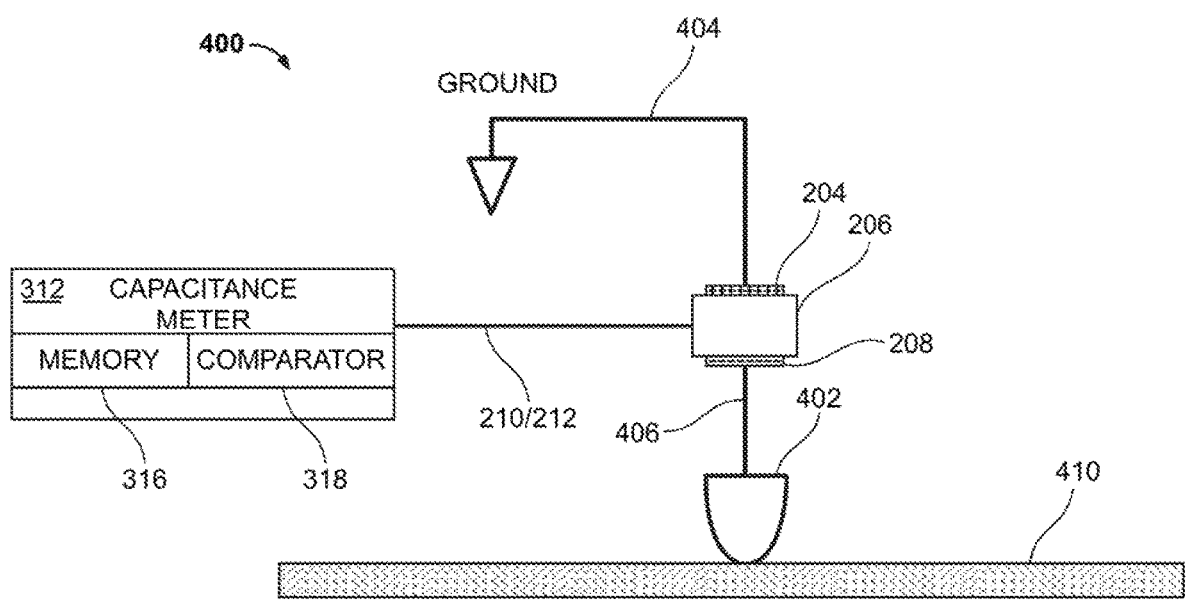
FIG. 4 illustrates an example system for use in detecting a potential of a surface in accordance with aspects of the present disclosure.

FIG. 4 illustrates an example potential detecting system 400 for use in detecting a potential of a surface in accordance with aspects of the present disclosure.

As shown in the figure, potential detecting system 400 includes capacitive sensor 200, an electrode 402, a wire 404, a wire 406 and capacitance meter 312. Wire 404 electrically connects metal layer 204 of capacitive sensor 200 to ground. Wire 406 electrically connects metal layer 208 of capacitive sensor 200 to electrode 402. Wires 210 and 212 of capacitive sensor 200 are electrically connected to capacitance meter 312.

In operation, potential detecting system 400 arranged such that electrode 402 is disposed on surface 410. Any charges on surface 410 will conduct through electrode 402, through wire 406 and to metal layer 208 of capacitive sensor 200. Wire 404 electrically connects metal layer 204 of capacitive sensor 200 to ground. Accordingly, no charges will be detected on metal layer 204 of capacitive sensor 200.

In capacitive sensor 200, any charges on surface 410 will generate a voltage across non-linear permittivity dielectric material 206 as a result of metal layer 204 of capacitive sensor 200 being electrically connected to ground. The generated voltage will be based on the non-linear capacitance of non-linear permittivity dielectric material 206, as discussed above. The voltage will be provided to capacitance meter 312 via wires 210 and 212.

In a manner similar to electric field detecting system 300 discussed above, comparator 318 compares the detected voltage as provided by capacitive sensor 200 to the a priori information in memory 316 to determine the overall charge, Q, provided on capacitive sensor 200. Because metal layer 204 of capacitive sensor 200 is grounded, the determined overall charge, Q, will be the potential of surface 410.

Note that a continuous current is not required to measure the potential of surface 410. Instead, the potential of surface 410 is indirectly measured through the capacitance measurement. Because of this method, there is virtually no loading effect on surface 410.

The foregoing description of various embodiments has been presented for purposes of illustration and description. It is not intended to be exhaustive or to limit the disclosure to the precise forms disclosed, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto.

What is claimed as new and desired to be protected by Letters Patent of the United States is:

1. An electric field detecting system comprising:
   a first metal plate;
   a second metal plate;

a sensor having a first metal layer, a second metal layer and a non-linear permittivity dielectric material disposed between said first metal layer and said second metal layer, said first metal layer being electrically connected to said first metal plate, said second metal layer being electrically connected to said second metal plate; and a detector operable to detect a voltage between said first metal layer and said second metal layer and to determine a magnitude of the electric field based on the detected voltage and a priori information related to a variable capacitance of said non-linear permittivity dielectric material.

2. The electric field detecting system of claim 1, wherein said non-linear permittivity dielectric material comprises a material selected from a group of materials comprising barium strontium titanate, barium titanate, lead zirconium titanate and combinations thereof.

3. The electric field detecting system of claim 2,
wherein said first metal layer has a first surface having a first surface area, said first surface contacting said non-linear permittivity dielectric material,
wherein said non-linear permittivity dielectric material has a second surface contacting said first surface of said first metal layer, said second surface having a second surface area that is larger than said first surface area,
wherein said non-linear permittivity dielectric material has a third surface contacting said second metal layer, said third surface having a third surface area, and
wherein said second metal layer has a fourth surface having a fourth surface area, said fourth surface contacting said third surface, said fourth surface area being is smaller than said third surface area.

4. The electric field detecting system of claim 3, wherein said detector comprises a capacitance meter.

5. The electric field detecting system of claim 4, wherein said detector further comprises a lookup table having information stored therein based on detected capacitance as a function of voltage.

6. The electric field detecting system of claim 1,
wherein said first metal layer has a first surface having a first surface area, said first surface contacting said non-linear permittivity dielectric material,
wherein said non-linear permittivity dielectric material has a second surface contacting said first surface of said first metal layer, said second surface having a second surface area that is larger than said first surface area,
wherein said non-linear permittivity dielectric material has a third surface contacting said second metal layer, said third surface having a third surface area, and
wherein said second metal layer has a fourth surface having a fourth surface area, said fourth surface contacting said third surface, said fourth surface area being is smaller than said third surface area.

7. The electric field detecting system of claim 6, wherein said detector comprises a capacitance meter.

8. The electric field detecting system of claim 7, wherein said detector further comprises a lookup table having information stored therein based on detected capacitance as a function of voltage.

9. The electric field detecting system of claim 1, wherein said detector comprises a capacitance meter.

10. The electric field detecting system of claim 9, wherein said detector further comprises a lookup table having information stored therein based on detected capacitance as a function of voltage.

11. A system for use in detecting a potential of a surface, said system comprising:
a first metal layer;
a second metal layer;
a non-linear permittivity dielectric material disposed between said first metal layer and said second metal layer;
a lead connecting said first metal layer to ground;
an electrode connected to said second metal layer and being operable to contact the surface; and
a detector operable to detect a voltage between said first metal layer and said second metal layer, based on a voltage difference between ground and a potential of the surface, and to determine the potential of the surface based on a priori information related to a variable capacitance of said non-linear permittivity dielectric material.

12. The system of claim 11, wherein said non-linear permittivity dielectric material comprises a material selected from a group of materials comprising barium strontium titanate, barium titanate, lead zirconium titanate and combinations thereof.

13. The system of claim 12,
wherein said first metal layer has a first surface having a first surface area, said first surface contacting said non-linear permittivity dielectric material,
wherein said non-linear permittivity dielectric material has a second surface contacting said first surface of said first metal layer, said second surface having a second surface area that is larger than said first surface area,
wherein said non-linear permittivity dielectric material has a third surface contacting said second metal layer, said third surface having a third surface area, and
wherein said second metal layer has a fourth surface having a fourth surface area, said fourth surface contacting said third surface, said fourth surface area being is smaller than said third surface area.

14. The system of claim 13, wherein said detector comprises a capacitance meter.

15. The system of claim 14, wherein said detector further comprises a lookup table having information stored therein based on detected capacitance as a function of voltage.

16. The system of claim 11,
wherein said first metal layer has a first surface having a first surface area, said first surface contacting said non-linear permittivity dielectric material,
wherein said non-linear permittivity dielectric material has a second surface contacting said first surface of said first metal layer, said second surface having a second surface area that is larger than said first surface area,
wherein said non-linear permittivity dielectric material has a third surface contacting said second metal layer, said third surface having a third surface area, and
wherein said second metal layer has a fourth surface having a fourth surface area, said fourth surface contacting said third surface, said fourth surface area being is smaller than said third surface area.

17. The system of claim 16, wherein said detector comprises a capacitance meter.

18. The system of claim 17, wherein said detector further comprises a lookup table having information stored therein based on detected capacitance as a function of voltage.

19. The system of claim 11, wherein said detector comprises a capacitance meter.

20. An electric field detecting method comprising:
disposing an electric field detecting system within an electric field, the electric field detecting system including a first metal plate, a second metal plate, a sensor and a detector, the sensor having a first metal layer, a second metal layer and a non-linear permittivity dielectric material disposed between the first metal layer and the second metal layer, the first metal layer being electrically connected to the first metal plate, the second metal layer being electrically connected to the second metal plate;

detecting, via a detector, detect a voltage between the first metal layer and the second metal layer; and determining, via the detector, a magnitude of the electric field based on the detected voltage and a priori information related to a variable capacitance of the non-linear permittivity dielectric material.

* * * * *